United States Patent [19]

Mikahara

[11] Patent Number: 4,900,212
[45] Date of Patent: Feb. 13, 1990

[54] WAFER PICK OUT APPARATUS

[75] Inventor: Takanori Mikahara, Tuchiura, Japan

[73] Assignee: Texas Instruments Incorporated, Dallas, Tex.

[21] Appl. No.: 284,802

[22] Filed: Dec. 12, 1988

Related U.S. Application Data

[63] Continuation of Ser. No. 91,303, Aug. 26, 1987, abandoned, which is a continuation of Ser. No. 826,935, Feb. 6, 1986, abandoned.

[30] Foreign Application Priority Data

Feb. 15, 1985 [JP] Japan .................................. 6027707

[51] Int. Cl.⁴ .............................................. B65G 1/06
[52] U.S. Cl. ...................................... 414/416; 414/331
[58] Field of Search ............... 414/331, 416, 417, 225, 414/270, 273, 280, 226, 609, 751-753, 744.1; 198/468.2, 468.4

[56] References Cited

U.S. PATENT DOCUMENTS

| | | | |
|---|---|---|---|
| 3,823,836 | 7/1974 | Cheney et al. | 414/225 |
| 3,888,365 | 6/1975 | Reimann et al. | 414/273 X |
| 3,902,615 | 9/1975 | Levy et al. | 414/331 |
| 4,062,463 | 12/1977 | Hillman et al. | 414/225 |
| 4,367,915 | 1/1983 | Georges | 414/331 X |
| 4,378,189 | 3/1983 | Takeshita et al. | 414/331 X |
| 4,427,332 | 1/1984 | Manriquez | 414/331 |
| 4,501,527 | 2/1985 | Jacoby et al. | 414/744 B X |
| 4,553,069 | 11/1985 | Purser | 414/331 X |
| 4,558,983 | 12/1985 | Freeman et al. | 414/331 |
| 4,564,085 | 1/1986 | Melocik et al. | 414/273 X |
| 4,682,928 | 7/1987 | Foulke et al. | 414/416 |
| 4,712,963 | 12/1987 | Kondo | 414/417 X |
| 4,725,182 | 2/1988 | Sakamoto et al. | 414/331 |

Primary Examiner—David A. Bucci
Attorney, Agent, or Firm—William E. Hiller; N. Rhys Merrett; Melvin Sharp

[57] ABSTRACT

An apparatus for storing a plurality of articles each having a surface portion and conveying each of the articles to a desired position outside the apparatus, including a storage assembly for storing the articles so that the articles are positioned each with its surface portion spaced apart from another article to form a gap between every adjacent two of the articles, and a transfer assembly for conveying each of the articles to the desired position outside the apparatus, characterized by a fetch mechanism intervening in effect between the storage assembly and the transfer assembly and operative to move a selected one of the articles from the storage assembly to a predetermined position with respect to the transfer assembly.

6 Claims, 3 Drawing Sheets

WAFER PICK OUT APPARATUS

This application is a continuation of application Ser. No. 091,303, filed Aug. 26,1987, now abandoned, which is a continuation of application Ser. No. 826,935, filed Feb. 6,1986, now abandoned.

FIELD OF THE INVENTION

The present invention relates in general to an article storage and conveyor apparatus and, particularly, to a wafer-slice storage and conveyor apparatus to be used during manufacture of semiconductor integrated circuits.

BACKGROUND OF THE INVENTION

During manufacture of semiconductor integrated circuits, a wafer-slice storage and conveyor apparatus is used by means of which a number of wafer slices to be in stock are stored in column form. Such a storage and conveyor apparatus includes a hollow, generally box-shaped storage unit having inner wall portions formed with a number of C-shaped grooves which are vertically arranged at regular intervals. Wafer slices are stored in the storage unit each with a portion of its peripheral edge received in each of the C-shaped grooves and can be delivered from the storage unit one by one by means of a transfer assembly which typically consists of a belt and pulley conveyor arrangement. The wafer slices are carried over by the transfer assembly to any process stage of the production line for the fabrication of semiconductor integrated circuits and may be returned to the storage unit also by means of the transfer assembly upon completion of the process steps at the stage.

Such a known storage and conveyor apparatus has a problem in that only the lowermost one of the wafer slices forming the columnar assembly within the storage unit is allowed to be passed to the transfer assembly during each delivery operation from the storage unit. The prior-art storage and conveyor apparatus further has a problem that none of the wafer slices which have been delivered from the storage unit can be returned to their respective original positions in the storage unit until the wafer slices which were taken out precedingly have been returned to the storage unit. These problems provide various restrictions on the steps of operation to be performed for the fabrication of integrated circuits using the wafer slices stored in the apparatus. Still another problem inherent in a prior-art storage and conveyor apparatus of the described general nature is that the wafer slices stored therein are received along their peripheral edges in the grooves in the storage unit and may therefore receive scratches on the lower surfaces of the edge portions thereof when the slices are being withdrawn out of the storage unit.

It is, accordingly, an important object of the present invention to provide an improved storage and conveyor apparatus which will provide an increased degree of flexibility in the operation for the fabrication of semiconductor integrated circuits and which will thus permit significant reduction in the production costs of the integrated circuits.

It is another important object of the present invention to provide an improved storage and conveyor apparatus by means of which any desired wafer slice can be selected and transferred to a process stage from among the number of wafer slices stored in a storage unit without respect to the order in which the individual wafer slices are arranged in the storage unit.

It is still another important object of the present invention to provide an improved storage and conveyor apparatus in which the wafer slice which has once been taken out of the storage unit and used at the process stage can be returned to its initial position in the storage unit also without respect to the order in which the individual wafer slices are arranged in the storage unit.

It is thus still another important object of the present invention to provide an improved storage and conveyor apparatus which requires no extra storage unit additional to the storage unit currently in use.

It is, yet, still another important object of the present invention to provide an improved storage and conveyor apparatus in which a wafer slice is protected from being subjected to sliding friction that would otherwise produce scratches on the surface of the wafer slice while the slice is being withdrawn from the storage unit.

SUMMARY OF THE INVENTION

In accordance with the present invention, there is provided an apparatus for storing a plurality of articles each having a surface portion and conveying each of the articles to a desired position outside the apparatus, including (a) storage means for storing the articles so that the articles are positioned each with its surface portion spaced apart from another article to form a gap between every adjacent two of the articles, and (b) transfer means for conveying each of the articles to the desired position outside the apparatus, characterized by (c) fetch means intervening in effect between the storage means and the transfer means and operative to move a selected one of the articles from the storage means to a predetermined position with respect to the transfer means.

The fetch means may comprise a retainer unit movable in a first direction into and out of any of the gaps formed between the adjacent ones of the articles in the storage means and in a second direction substantially perpendicular to the first direction. In this instance, the aforesaid retainer unit may have a chamber defined therein and is formed with an aperture open to the suction chamber and to the outside of the apparatus on a plane substantially parallel with the surface portion of each of the articles stored in the storage means, the suction chamber being communicable with a source of suction to develop a suction therein. Typically, the storage means is adapted to have the articles spaced apart from each other in the aforesaid second direction and the transfer means is adapted to have each of the articles conveyed to the desired position in the aforesaid first direction.

BRIEF DESCRIPTION OF THE DRAWINGS

The drawbacks of a prior-art storage and conveyor apparatus and the features and advantages of a storage and conveyor apparatus according to the present invention will be more clearly understood from the following description taken in conjunction with the accompanying drawings in which like reference numerals designate similar or corresponding units, members and elements and in which.

DESCRIPTION OF THE PRIOR ART

Figure 1:
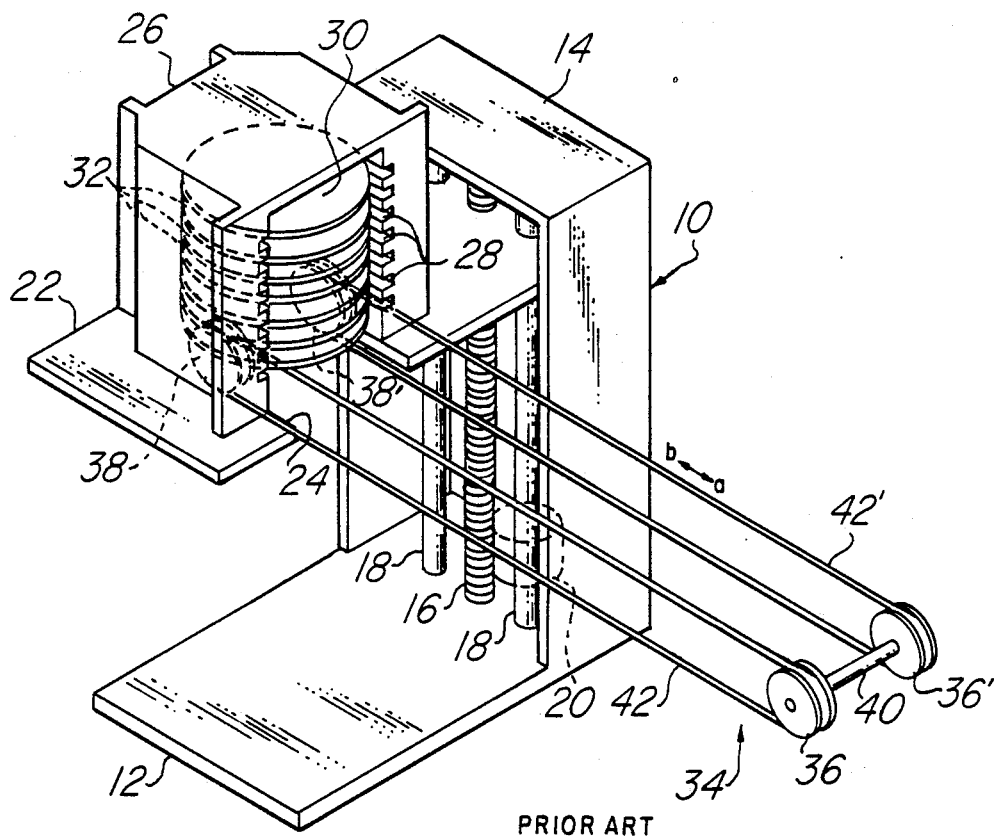
FIG. 1 is a perspective view showing a representative example of a known wafer-slice storage and conveyor apparatus of the type to which the present invention generally appertains.

Referring to FIG. 1 of the drawings, a prior-art wafer-slice storage and conveyor apparatus includes a stationary support structure 10 upstanding from a horizontal base plate 12 and having a horizontal upper wall portion 14 over the base plate 12. A screw shaft 16 extends vertically between the base plate 12 and the upper wall portion 14 of the support structure 10 and is rotatable about its center axis with respect to the support structure 10. The screw shaft 16 is paralleled by a pair of guide bars 18 which also extend between the base plate 12 and wall portion 14. The screw shaft 16 is driven for rotation about its center axis by means of a suitable drive unit 20 which is shown positioned on the base plate 12 as indicated by broken lines. A horizontal platform plate 22 has an internally threaded hole and a pair of plain holes located on both sides of the threaded hole. The platform plate 22 is cantilevered from the screw shaft 16 and guide bars 18 with the screw shaft 16 passed through the threaded hole and the guide bars 18 passed through the pair of plain holes, respectively, in the plate 22 as shown. As the screw shaft 16 is driven for rotation by the drive unit 20, the platform plate 22 is thus caused to move upwardly or downwardly along the screw shaft 16 and guide bars 18 due to the mating engagement between the screw shaft 16 and the platform plate 22 through the threaded hole in the plate 22.

The platform plate 22 is further formed with a generally U-shaped recess 24 and has fixedly supported on its upper face a hollow, box-shaped storage unit 26 defining therein a vertically elongated, generally semicylindrical concavity. The storage unit 26 has inner wall portions formed with a number of generally C-shaped grooves 28 which are vertically arranged at regular intervals and which are located above and along the edge defining the U-shaped recess 24 in the platform plate 22. The storage unit 22 further has a vertical inlet/outlet opening 30 formed above the recess 24, each of the C-shaped grooves 28 having its opposite ends located at this inlet/outlet opening 30. Wafer slices 32 are stored generally in the form of a column within the storage unit 22 and are vertically spaced apart in parallel from one another above the recess 24 in the platform plate 22, each slice being received along a portion of its peripheral edge in each of the grooves 28.

The wafer slices 32 stored in the storage unit 26 as above described are delivered from the storage unit one by one by means of a transfer assembly 34 which includes a pair of drive pulleys 36 and 36' and a pair of driven pulleys 38 and 38'. The drive pulleys 36 and 36' are spaced apart parallel to each other a distance less than the diameter of the wafer slices 32 to be handled in the shown apparatus, and are coupled together by a common drive shaft 40. The driven pulleys 38 and 38' are also spaced apart in parallel to each other and are aligned with the drive pulleys 36 and 36', respectively. These driven pulleys 38 and 38' are located vertically in alignment with the U-shaped recess 24 in the platform plate 22 so that the column of the wafer slices 32 housed within the storage unit 26 is positioned above the pulleys 38 and 38'. Between the pulleys 36 and 38 and between the pulleys 36' and 38' are passed endless belts 42 and 42', respectively, which have travelling path portions below the column of the wafer slices 32 within the storage unit 26. The endless belts 42 and 42' horizontally extend in parallel with each other and are movable back and forth as indicated by arrows a and b as the drive pulleys 36 and 36' rotate. The drive pulleys 36 and 36' are to be driven for rotation about the center axis of the common drive shaft 40 by suitable drive means which may be provided in association with the drive shaft 40, though not shown in the drawings.

For the delivery of the wafer slices 32 from the storage unit 22, the screw shaft 16 is driven for rotation in a direction to move the platform plate 22 downwardly with respect to the driven pulleys 38 and 38'. The screw shaft 16 is brought to a stop when the lowermost one of the wafer slices 32 in the storage unit 22 is received on the upper portions of the belts 42 and 42' in the vicinity of the driven pulleys 38 and 38'. The drive means associated with the common drive shaft 40 of the transfer assembly 34 is then actuated to drive the drive pulleys 36 and 36' for rotation so that the endless belts 42 and 42' are caused to travel with the upper course of each belt moving in the direction of arrow a. The wafer slice 32 received on the belts 42 and 42' is thus conveyed out of the storage unit 26 through the inlet/outlet opening 30 in the unit 22 and is conveyed toward the driven pulleys 36 and 36'. When the wafer slice 32 reaches a predetermined position with respect to the process stage at which the particular slice is to processed, the drive pulleys 36 and 36' are brought to a stop and allow the wafer slice to be transferred from the belts 42 and 42' to the process stage. The wafer slices 32 stored in the storage unit 26 can be in this manner transferred one by one to the process stage of the production line by means of the transfer assembly 34. Upon completion of the operation at the process stage, the wafer slices 32 may be returned also one by one to the storage unit 26 with the drive pulleys 36 and 36' driven for rotation in a reverse direction to cause the endless belts 42 and 42' to travel with the upper course of each belt moving in the direction of arrow b.

The prior-art storage and conveyor apparatus constructed and arranged as above described has a drawback in that, for each delivery operation from the storage unit 26, there is no choice allowed from among the wafer slices 32 in taking out a wafer slice from the stock of the wafer slices in the storage unit 26. Only the lowermost one of the wafer slices 32 forming the columnar assembly within the storage unit 26 can be passed to the endless belts 42 and 42' for each delivery operation from the unit 26. The wafer slices 32 can thus be delivered from the storage unit 26 only in the particular sequence in which the individual wafer slices 32 are vertically arranged from the bottom of the storage unit 26. This places various restrictions on the steps of operation to be performed for the fabrication of integrated circuits using the wafer slices stored in the apparatus. Another and similar problem is that, when any two wafer slices 32 which have been positioned adjacent each other within the storage unit 26 are to be returned to such positions after they have been processed outside the storage unit 26, the former one of the two could not be returned to its original position unless and until the latter is returned to its original position in the storage unit 26. Thus, none of the wafer slices 32 which have been delivered from the storage unit 26 can be returned to their respective original positions in the storage unit 26 until the wafer slices which have been taken out precedingly are returned to the storage unit 26 if, at all, all the wafer slices 32 that have been delivered from the storage unit 26 are to be returned to the unit 26. Such an inconvenience could not be avoided without provision of an additional storage unit independently of the storage unit 26 currently in use.

These problems in a prior-art storage and conveyor apparatus of the described nature are of more importance under the present circumstances of the semiconductor industry in which there is a trend of using larger wafer slices for the fabrication of integrated circuits. The use of larger wafer slices requires the provision of the larger slice storage unit, which in turn results in the more serious space requirements in the production plants and facilities and accordingly in the higher production costs of semiconductor integrated circuits.

There is still another problem inherent in a prior-art storage and conveyor apparatus of the nature described with reference to FIG. 1. The wafer slices 32 stored in the storage unit 26 being received along their peripheral edges in the C-shaped grooves 28 in the unit 26, the wafer slices 32 are subjected to sliding friction and may receive scratches on the lower surfaces of the edge portions thereof when the slices are being withdrawn out of the storage unit 26.

The present invention contemplates elimination of these problems which have thus far been encountered in a storage and conveyor apparatus of the described nature.

DESCRIPTION OF THE PREFERRED EMBODIMENT

While an article storage and conveyor apparatus according to the present invention will be hereinafter described for use for handling wafer slices during fabrication of semiconductor integrated circuits, it should be borne in mind that a storage and conveyor apparatus proposed by the present invention will find a wide variety of applications for the storage and conveyance of other articles insofar as each of the articles has a surface portion which is typically flat and uniplanar.

Figure 2:
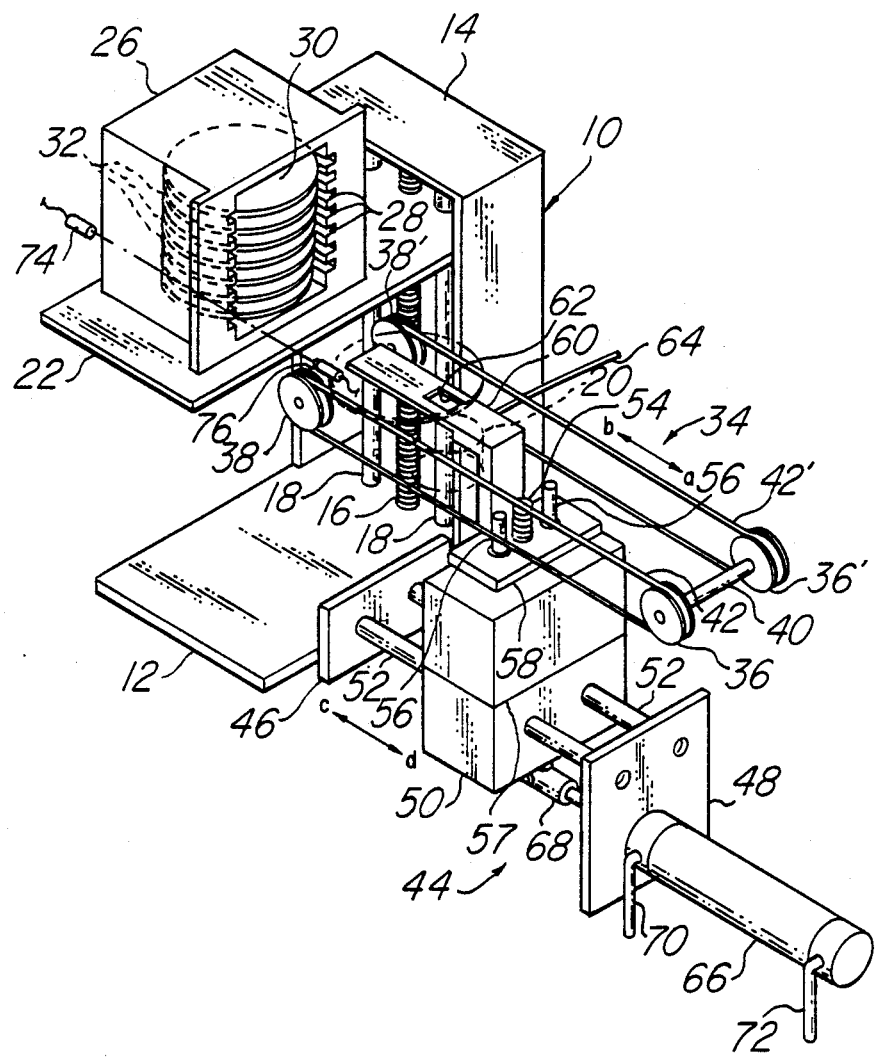
FIG. 2 is a view similar to FIG. 1 but shows a preferred embodiment of an article storage and conveyor apparatus according to the present invention.

Referring now to FIG. 2 of the drawings, a storage and conveyor apparatus embodying the present invention comprises wafer slice storage means which is generally in construction to its counterpart in the prior-art storage and conveyor apparatus shown in FIG. 1. The preferred embodiment of the present invention is thus shown also comprising a wafer-slice storage assembly including a support structure 10 upstanding from a base plate 12 and having an upper wall portion 14. An elongated, threaded member or screw shaft 16 and a pair of parallel guide bars 18 extend between the base plate 12 and the upper wall portion 14 of the support structure 10. The screw shaft 16 is driven for rotation by means of a drive unit 20 positioned on the base plate 12. Though not shown in the drawings, the drive unit 20 for the screw shaft 16 may include a reversible motor and a reduction gear assembly operatively coupling the motor output shaft to the screw shaft 16. A platform plate 22 is cantilevered from the screw shaft 16 and guide bars 18 through a threaded hole and a pair of plain holes formed in the plate 22 as previously described with reference to FIG. 1. The platform plate 22 has supported on its upper face a storage unit 26 defining therein a generally semicylindrical concavity. The storage unit 26 is formed with a number of C-shaped grooves 28 which are arranged at regular intervals. Each of the C-shaped grooves 28 has its opposite ends located at a vertical inlet/outlet opening 30. The storage unit 26 of the embodiment of the present invention is thus also adapted to have wafer slices 32 stored in column form therein with each of the slices received along a portion of its peripheral edge in each of the grooves 28 so that the individual wafer slices 32 are vertically spaced apart in parallel from one another in the platform plate 22. The storage unit 26 may be detachably fastened to or simply placed on the upper face of the platform plate 22, although it may be constructed as integral part of the platform plate 22. Each of the wafer slices 32 thus stored in the storage unit 26 is assumed to be in the form of a circular disc, and, thus, the C-shaped grooves 28 in the inner wall portions of the storage unit 26 have a common radius which is slightly larger than the radius of the wafer slices 32.

The wafer slices 32 stored in the storage unit 26 in this fashion are selectively delivered from the storage unit 26 by means of a transfer assembly 34 which is also similar in construction to its counterpart in the prior-art storage and conveyor apparatus shown in FIG. 1. The transfer assembly 34 thus comprises a pair of drive pulleys 36 and 36' and a pair of driven pulleys 38 and 38'. The drive pulleys 36 and 36' are coupled together by a common drive shaft 40 and the driven pulleys 38 and 38' are aligned horizontally with the drive pulleys 36 and 36', respectively. Between the pulleys 36 and 38 and between the pulleys 36' and 38' are passed endless belts 42 and 42', respectively, which have travelling path portions below the column of the wafer slices 32 within the storage unit 26. The endless belts 42 and 42' extend in parallel with each other and are spaced apart in parallel from each other a distance less than the diameter of the wafer slices 32. The drive pulleys 36 and 36' are to be driven for rotation about the center axis of the common drive shaft 40 by suitable drive means (not shown). The drive means may also include a reversible motor and a reduction gear unit operatively coupling the motor output shaft and the shaft 40.

In the shown embodiment of the present invention, the transfer assembly 34 is used in combination with a fetch mechanism which is operative to fetch a selected one of the wafer slices 32 in the storage unit 26 and to transfer the slice 32 to the transfer assembly 34.

The fetch mechanism, which in its entirety is represented by reference numeral 44, comprises two stationary support members 46 and 48 which are spaced apart in a direction parallel with the direction in which the wafer slices 32 are to be conveyed out of or into the storage unit 26. A pair of guide bars 52 extend horizontally between these support members 46 and 48 and are spaced apart in parallel from each other below the transfer assembly 34. A carrier block 50 is slidable on these guide bars 52 back and forth between the support members 46 and 48 and has an elongated, threaded member or screw shaft 54 and a pair of guide bars 56 provided therein. The screw shaft 54 and guide bars 56 extend vertically through the carrier block 50 and project upwardly therefrom. The screw shaft 54 is rotatable about its center axis with respect to the carrier block 50 and is driven for rotation by a suitable drive unit 57. The drive unit 57 is supported on the carrier block 50 and may include a reversible motor and a reduction gear assembly operatively coupling the motor output shaft to the screw shaft 54 though not shown in the drawings. The screw shaft 54 and guide bars 56 are engaged by a horizontal support plate 58 which is positioned above the drive unit 57. The support plate 58 is formed with a threaded hole having the screw shaft 54 passed therethrough and a pair of plain holes located on both sides of the threaded hole and having the guide bars 56 respectively passed therethrough. As the screw shaft 54 is driven for rotation with respect to the carrier block 50, the support plate 58 is caused to move upwardly or downwardly with respect to the carrier block 50 along the screw shaft 54 and guide bars 56 due to the mating engagement between the screw shaft 54 and the support plate 58 through the threaded hole in the plate 58.

The fetch mechanism 44 of the shown embodiment further comprises a hollow retainer unit 60 typically having a flat horizontal upper face and extending in a direction parallel with the direction in which the wafer slices 32 are to be moved out of or into the storage unit 26. The retainer unit 60 has a suction chamber (not shown) defined therein and has formed in its upper wall portion an aperture 62 open on one hand to the suction chamber and on the other hand to the outside of the apparatus on a plane parallel with the lower surface of each of the wafer slices 32 stored in the storage unit 26. The suction chamber in the retainer unit 60 is communicable with a source of suction such as a vacuum pump (not shown) through a flexible suction conduit 64. Though not shown in the drawings, the suction conduit 64 is provided with a three-way valve having two inlet ports one communicating with the source of suction and the other open to the atmosphere and an outlet port communicating with the suction chamber in the retainer unit 60. As the screw shaft 54 in the carrier block 50 is driven for rotation, the retainer unit 60 is caused to move upwardly or downwardly with respect to and below a horizontal plane defined by the upper portions of the endless belts 42 and 42' of the transfer assembly 34.

The carrier block 50 thus carrying the retainer unit 60 is driven for movement on and along the guide bars 52 in the directions of arrows c and d by suitable drive means. In the embodiment herein shown, such drive means comprises a fluid-operated power cylinder 66 having its cylinder body fixedly attached to one of the support members such as the support member 48 as shown. The power cylinder 66 has a plunger 68 axially projecting from the cylinder body and secured at its leading end to the carrier block 50. The power cylinder 66 further has a piston provided in the fluid chamber defined in the cylinder body thereof and is formed with fluid inlet and outlet ports. These fluid inlet and outlet ports are respectively communicable through conduits 70 and 72 with a source of fluid under pressure and a suitable fluid reservoir, though not shown in the drawings. The apparatus according to the present invention may further comprise sensing means to detect the presence or absence of a wafer slice 32 in the storage unit 26 at a predetermined height over the base plate 12. In the embodiment herein shown, such sensing means comprises a combination of a light emitter element 74 and a photoelectric transducer element 76 which are fixedly located in alignment with each other with respect to the support structure 10. The light emitter and photoelectric transducer elements 74 and 76 are arranged one on one side of the concavity in the storage unit 26 and the other on other other side of the concavity so that the beam of light emanating from the former reaches the latter in the absence of a light intersecting object between the elements.

Description will be hereinafter made with reference to FIG. 2 and further to FIG. 3 in regard to the mode of operation of the storage and conveyor apparatus thus constructed and arranged.

Figure 3:
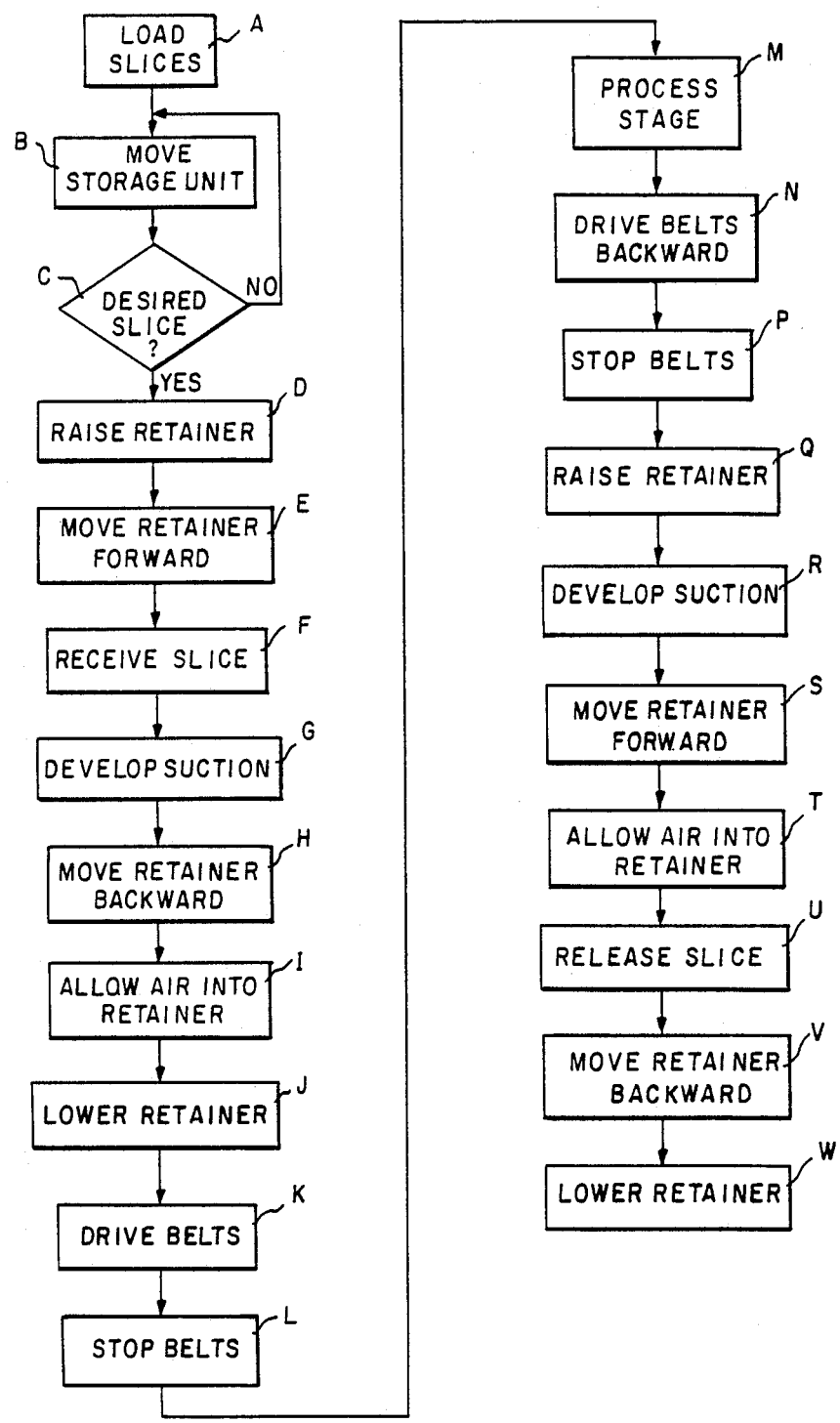
FIG. 3 is a flowchart showing the series of steps of operation to be performed in the storage and conveyor apparatus illustrated in FIG. 2.

Prior to the start of operation, a plurality of wafer slices 32 are loaded into the storage unit 26 as indicated by block "A" in FIG. 3 with the platform plate 22 positioned at a certain height over the base plate 12. The operation starts with actuation of the drive unit 20 to drive the screw shaft 16 of the storage assembly for rotation to cause the platform plate 22 to move upwardly or downwardly to a selected height over the base plate 12 as indicated by block "B" in FIG. 3. The screw shaft 16 is brought to a stop when the platform plate 22 reaches the selected height at which a desired one of the wafer slices 32 is to be accessed by the fetch mechanism 44. The selected height to which the platform plate 22 is to be moved is such that, with the platform plate positioned at such a height, the desired wafer slice 32 has its lower face located slightly above the horizontal plane defined by the upper portions of the endless belts 42 and 42' of the transfer assembly 34. The sensing means comprising the light emitter and photoelectric transducer element 74 and 76 then determines whether there is a wafer slice 32 located at a predetermined height over the base plate 12, as indicated by block "C" in FIG. 3. If it is found that there is no wafer slice in the storage unit 26 at the predetermined height over the base plate 12, the step indicated by the process block "B" is repeated to move the platform plate 22 to upwardly or downwardly to the selected height. When it is finally ascertained that there is certainly a wafer slice positioned at the predetermined height over the base plate 12, the fetch mechanism 44 is initiated into motion with the drive unit 57 on the carrier block 50 actuated.

The drive unit 57 being thus actuated, the screw shaft 54 on the carrier block 50 is driven for rotation to cause the support plate 58 to move upwardly until the upper flat face of the retainer unit 60 reaches the horizontal plane defined by the upper portions of the endless belts 42 and 42' of the transfer assembly 34 as indicated by block "D" in FIG. 3. The screw shaft 54 is brought to a stop when the retainer unit 60 is raised to such a position so that the wafer slice 32 to be accessed has its lower face located slightly above the above mentioned horizontal plane. Subsequently, the fluid-operated power cylinder 66 is actuated to drive the carrier block 50 to move forwardly along the guide bars 52 in the direction of arrow c so that the retainer unit 60 is caused to move toward the desired wafer slice 32 through the inlet/outlet opening 30 of the storage unit 26 as indicated by block "E" in FIG. 3. The retainer unit 60 is thus moved into the storage unit 26 and advances forwardly through the horizontal gap between the desired wafer slice and the wafer slice immediately underlying the desired wafer slice. The drive unit 57 on the carrier block 50 is for a second time actuated to drive the retainer unit 60 to further move slightly upwardly with respect to the desired wafer slice 32 so that the particular wafer slice 32 is received on the upper face of the retainer unit 60 as indicated by block "F" in FIG. 3. It may be noted in this instance that the retainer unit 60 is still slightly moved upwardly after the wafer slice 32 has been received thereon so that the peripheral edge portion of the wafer slice floats within the C-shaped groove 28 which has been engaged by the slice 32. The desired wafer slice 32 being thus received on the retainer unit 60, the aperture 62 in the retainer unit 60 is sealed off by the lower face of the wafer slice 32. The three-way valve provided in association with the suction conduit 64 is now actuated to establish communication between the source of suction and the suction chamber in the retainer unit 60, thereby developing a suction in the retainer unit 60 as indicated by block "G" in FIG. 3. The suction developed in the retainer unit 60 acts on the lower face of the desired wafer slice 32 which is therefore firmly retained to the retainer unit 60. The power cylinder 66 is then actuated to drive the carrier block 50 to move this time backwardly along the guide bars 52 in the direction of arrow d so that the retainer unit 60 having the wafer slice 32 carried thereon is caused to move out of and then away from the storage unit 26 through the inlet/outlet opening 30 in the unit 26 as indicated by block "H" in FIG. 3. It may be noted that, while the retainer unit 60 is being thus moved away from the storage unit 26, the wafer slice 32 on the retainer unit 60 has its lower face maintained slightly above the horizontal plane defined by the upper portions of the endless belts 42 and 42' and is for this reason not interfered with by the belts 42 and 42'. When the retainer unit 60 reaches a predetermined position above the upper portions of the endless belts 42 and 42' close to the driven pulleys 38 and 38', the three-way valve associated with the suction conduit 64 is actuated to allow atmospheric air into the suction chamber in the retainer unit 60 to eliminate the suction in the chamber as indicated by block "I" in FIG. 3, thereby making the wafer slice 32 on the retainer unit 60 ready to be detached therefrom. The drive unit 57 is then actuated to drive the retainer unit 60 to move to its initial position with respect to the carrier block 50 as indicate by block "J" in FIG. 3 with the result that the wafer slice 32 on the retainer unit 60 is received onto the upper portions of the endless belts 42 and 42' which are held at rest at this point of time.

The drive means associated with the common drive shaft 40 of the transfer assembly 34 is now actuated to drive the drive pulleys 36 and 36' for rotation so that the endless belts 42 and 42' are caused to travel with the upper course of each belt moving in the direction of arrow a. The wafer slice 32 received on the belts 42 and 42' is conveyed toward the drive pulleys 36 and 36' as indicated by block "K" in FIG. 3. When the wafer slice 32 reaches a predetermined position with respect to the process stage at which the particular slice is to be processed, the drive pulleys 36 and 36' are brought to a stop as indicated by block "L" and the wafer slice 32 is allowed to be transferred from the belts 42 and 42' to the process stage for the fabrication of semiconductor integrated circuits as indicated by block "M" in FIG. 3.

Upon completion of the processing at the process stage, the wafer slice 32 may be returned to the storage unit 26 for further storage therein. For this purpose, the wafer slice 32 which has been processed is transferred back to the endless belts 42 and 42' which are at this point of time held at rest. The drive pulleys 36 and 36' are then driven for rotation to cause the endless belts 42 and 42' to travel with the upper course of each belt moving in the direction of arrow b as indicated by block "N" in FIG. 3 until the wafer slice 32 on the belts 42 and 42' reaches the initial predetermined position above the upper portions of the endless belts 42 and 42' in the vicinity of the driven pulleys 38 and 38'. The drive pulleys 36 and 36' are then brought to a stop as indicated by block "P" in FIG. 3. Thereupon, the drive unit 57 is actuated to drive the associated screw shaft 54 for rotation to cause the support plate 58 to move upwardly until the upper flat face of the retainer unit 60 reaches the horizontal plane defined by the upper portions of the endless belts 42 and 42' as indicated by block "Q" in FIG. 3. The screw shaft 54 is brought to a stop when the retainer unit 60 is raised to a position so that the wafer slice 32 is received on the upper face of the retainer unit 60. The wafer slice 32 having been received on the retainer unit 60, the aperture 62 in the retainer unit 60 is closed by the lower face of the wafer slice 32 as previously noted. The three-way valve associated with the suction conduit 64 is now actuated to develop a suction for a second time in the retainer unit 60 as indicated by block "R" in FIG. 3. The suction developed in the retainer unit 60 acts on the lower face of the wafer slice 32 which is therefore firmly attached to the retainer unit 60 as also noted previously. The power cylinder 66 is then actuated to drive the carrier block 50 to move forwardly in the direction of arrow c so that the retainer unit 60 having the wafer slice 32 carried thereon is caused to move toward and then into the storage unit 26 through the inlet/outlet opening 30 of the unit 26 as indicated by block "S" in FIG. 3. When the wafer slice 32 on the retainer unit 60 is moved in its entirety into the storage unit 26, the power cylinder 66 is brought to a stop and the three-way valve associated with the suction conduit 64 is actuated to allow atmospheric air into the suction chamber in the retainer unit 60 as indicated by block "T" in FIG. 3. The drive unit 57 is then actuated to drive the retainer unit 60 to slightly move downwardly with respect to the storage unit 26 so that the wafer slice 32 on the retainer unit 60 correctly reaches its initial position within the storage unit 26 and has a portion of its peripheral edge received in the C-shaped groove 28 allocated to the particular slice as indicated by block "U" in FIG. 3. The power cylinder 66 is then actuated to drive the carrier block 50 to move backwardly in the direction of arrow d with the retainer unit 60 disengaged from the wafer slice 32 left in the storage unit 26 as indicated by block "V" in FIG. 3. When the retainer unit 60 reaches a position above the upper portions of the endless belts 42 and 42' close to the driven pulleys 38 and 38', the drive unit 57 is actuated to drive the retainer unit 60 to move downwardly to its initial position with respect to the carrier block 50 as indicated by block "W" in FIG. 3.

As will have been understood from the foregoing description a storage and conveyor apparatus proposed by the present invention is advantageous inter alia in that any desired wafer slice can be selected and transferred to the process stage from among the number of wafer slices 32 stored in the storage unit 26 without respect to the order in which the individual wafer slices are arranged in the storage unit 26. This will provide an increased degree of flexibility in the operation for the fabrication of semiconductor integrated circuits and will thus permit significant reduction in the production costs of the integrated circuits. Because, furthermore, of the fact that the wafer slice which has once been taken out of the storage unit 26 and used at the process stage can be returned to its initial position in the storage unit 26 also without respect to the order of arrangement of the wafer slices in the storage unit 26, there is no need of providing an additional storage unit independently of the storage unit 26 in use. A third outstanding advantage of a storage and conveyor apparatus according to the present invention is that the retainer unit 60 is slightly moved upwardly after the wafer slice 32 being withdrawn from the storage unit has been received thereon so that the peripheral edge portion of the wafer slice is permitted to float within the C-shaped groove 28 which has been engaged by the slice 32. For this reason and because of the fact that the wafer slice 32 which has been received on the retainer unit 60 is retained thereto by the suction developed in the retainer unit 60, the wafer slice is protected from being subjected to sliding friction that would otherwise produce scratches on the lower surface of the slice while the slice is being withdrawn from the storage unit 26. Retaining the wafer slice 32 to the retainer unit 60 by the aid of a suction is also useful for preventing the wafer slice from being dislodged or falling from the retainer unit 60 while the wafer slice is being passed on to the belts 42 and 42' of the transfer assembly 34.

While the drive means for the storage unit 26 and the retainer unit 60 have been described to be constituted each by the combination of a screw shaft and a nut member and the drive means for the carrier block 50 described as being constituted by the fluid-operated power cylinder 66, such drive means are merely for the purpose of illustration and may be substituted by any appropriate forms of drive means. It should be further borne in mind that a storage and conveyor apparatus according to the present invention is characterized particularly by the provision of the fetch means and that the storage means and the transfer means which have been described as being used in combination with such fetch means are not limited to those forming part of the described embodiment.

What is claimed:

1. An apparatus for storing a plurality of articles, each having a surface portion, and conveying selected ones of the articles to a desired position, said apparatus comprising:
  means for storing said plurality of articles in a vertical columnar arrangement, successive articles being spaced from each other to define a gap between adjacent articles;
  means for conveying said articles to said desired position, said conveying means including a pair of endless conveyance members running between the storing means and the desired position; and
  means operative to at least partially enter said storing means for moving any one of said plurality of articles as a selected one of said articles from the storing means to a predetermined position with respect to said conveying means, said operative means being positioned and shaped to fit between the pair of endless conveyance members.

2. An apparatus for storing a plurality of articles, each having a surface portion, and conveying selected ones of the articles to a desired position, said apparatus comprising:
  means for storing said articles spaced from each other with a gap between adjacent articles;
  means for conveying said articles to said desired position, said conveying means including a pair of endless conveyance members running between the storing means and the desired position;
  means operative to at least partially enter said storing means for moving a selected one of said articles from the storing means to a predetermined position with respect to said conveying means, said operative means being positioned and shaped to fit between the pair of endless conveyance members; and
  said operative means comprising a retainer unit movable in a first direction into and out of the gaps between said articles in said storing means and in a second direction substantially perpendicular to said first direction to a position which slightly lifts said selected one of said articles prior to again moving in said first direction.

3. An apparatus as set forth in claim 2, wherein said retainer unit has a suction chamber defined therein and is formed with an aperture open to the suction chamber and to the outside of the retainer unit on a plane substantially parallel with a surface portion of the articles stored in said storing means, said suction chamber being communicable with a source of suction to develop a suction therein.

4. An apparatus as set forth in claim 2, wherein said storing means is adapted to have said articles spaced apart from each other in said second direction and said conveying means is adapted to have each of said articles conveyed to said desired position in said first direction.

5. An apparatus for storing a plurality of articles, each having a substantially planar surface portion, and conveying selected ones of the articles to a desired position, said apparatus comprising:
  a storage bin having a plurality of article-holding grooves defined therein and arranged in spaced vertical registration for storing said plurality of articles in a vertical columnar arrangement with each article being receivable by a respective article-holding groove such that successive articles are spaced from each other by virtue of the space between adjacent article-holding grooves to define a gap between adjacent articles, said storage bin being open on at least one side thereof to expose the plurality of article-holding grooves and the articles received therein;
  means for conveying said articles to said desired position, said conveying means including a pair of endless conveyance members disposed in parallel spaced apart relationship and extending between said storage bin and the desired position;
  a retainer unit disposed between said pair of endless conveyance members, said retainer unit having a substantially planar top surface and being provided with a suction chamber, the top surface of said retainer unit having an aperture provided therein communicating with said suction chamber;
  first means for moving said retainer unit horizontally in a first bidirectional path so as to dispose said retainer unit at least partially within said storage bin for reception within a space defined between adjacent article-holding grooves at one extent of said first bidirectional path and to dispose said retainer unit outwardly with respect to said storage bin in a retracted position at the other extent of said first bidirectional path;
  second means for moving said retainer unit vertically in a second bidirectional path;
  said retainer unit being selectively disposable at least partially within said storage bin with the aperture in the top surface thereof located in vertical registration below any desired one of the article-holding grooves for receiving an article mounted in said one article-holding groove on the top surface of said retainer unit;

means to apply suction to said aperture in the top surface of said retainer unit via said suction chamber for holding the article mounted in said one article-holding groove on the top surface of said retainer unit;

said retainer unit being movable vertically in said second bidirectional path upwardly with respect to said storage bin to raise the article held on the top surface thereof a sufficient amount to clear a surface of said storage bin defining the lower boundary of said one article-holding groove in response to the actuation of said second moving means;

said retainer unit then being movable horizontally in said first bidirectional path to dispose said retainer unit in the retracted position at the other extent of said first bidirectional path and locating said article held by the top surface of said retainer unit over said pair of endless conveyance members outwardly with respect to said storage bin; and the article being released from the top surface of said retainer unit in response to deactivation of said suction-applying means for subsequent conveyances thereof to the desired position by said pair of endless conveyance members.

6. An apparatus as set forth in claim 5, further including optical sensing means disposed in operable relationship to said storage bin for sensing the presence of an article mounted in said one article-holding groove without touching the article and prior to the entry of said retainer unit within said storage bin.

* * * * *